Aug. 22, 1950 B. E. LENEHAN Re. 23,258
SINGLE SIDE-BAND SYSTEM
Original Filed Oct. 20, 1945
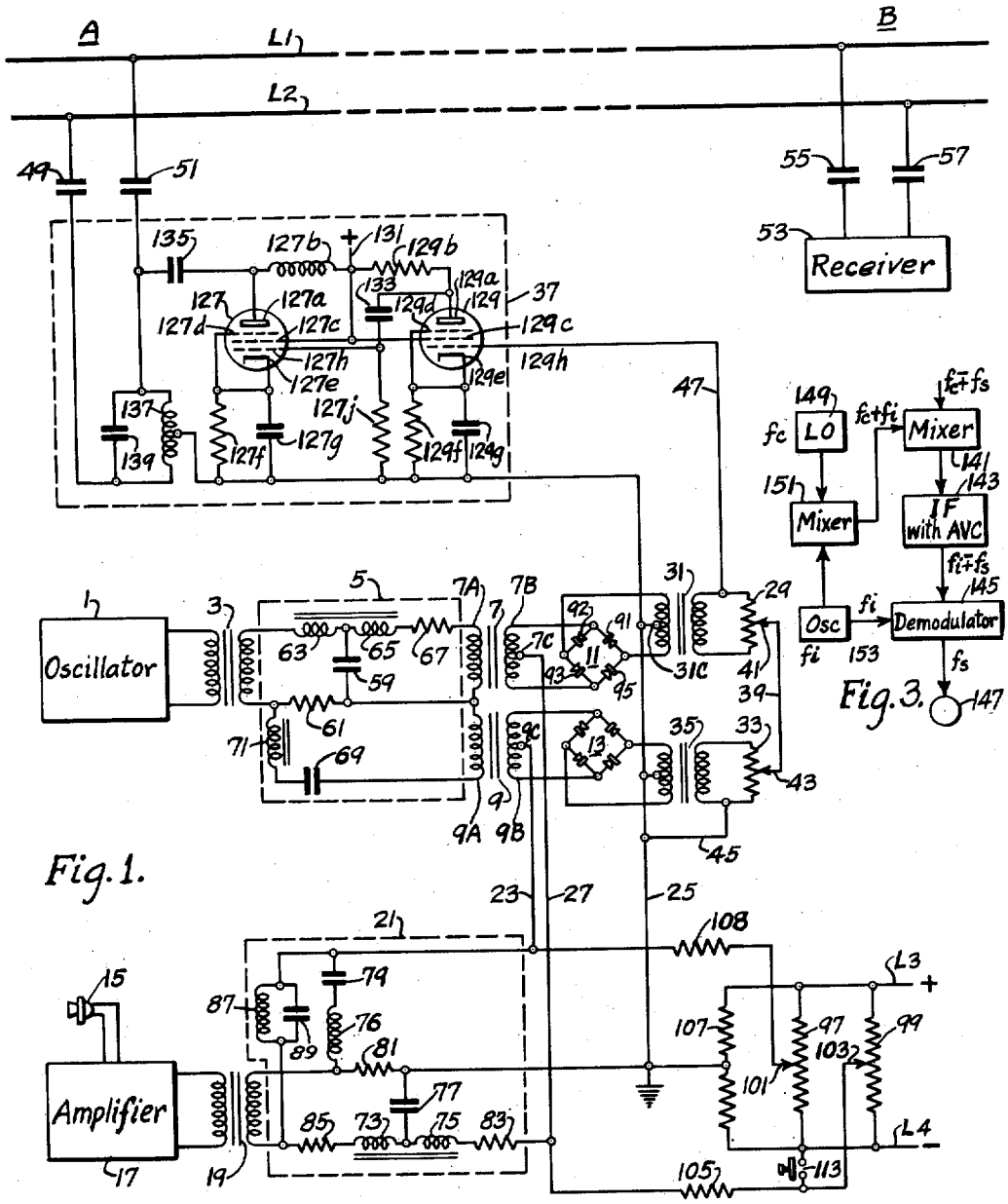
Fig. 1.
Fig. 3.
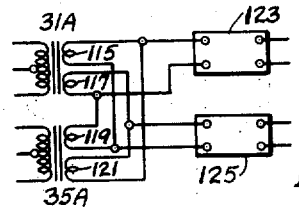
Fig. 2.
WITNESSES:
Leon J. Jaza,
John P. Shipman
INVENTOR
Bernard E. Lenehan.
BY C. L. Freedman
ATTORNEY Patented Aug. 22, 1950 Re. 23,258

UNITED STATES PATENT OFFICE 23,258

SINGLE SIDE-BAND SYSTEM

Bernard E. Lenehan, Bloomfield, N. J., assignor to Westinghouse Electric Corporation, East Pittsburgh, Pa., a corporation of Pennsylvania Original No. 2,476,880, dated July 19, 1949, Serial No. 623,594, October 20, 1945. Application for reissue December 28, 1949, Serial No. 135,411

24 Claims. (Cl. 332—45)

Matter enclosed in heavy brackets [ ] appears in the original patent but forms no part of this reissue specification; matter printed in italics indicates the additions made by reissue

This invention relates to systems for transmitting signals, and it has particular relation to single sideband systems.

The advantages of single side-band transmission are well known in the art. For example, reference may be made to the Radio Engineering Handbook, Third Edition, by Keith Henney, 1941, pages 552 and 553. This handbook is published by the McGraw-Hill Book Company of New York city. However, the size, cost and complexity of the equipment required for single side-band systems designed in accordance with the prior art have discouraged extensive commercial utilization of the system.

In accordance with the invention, an improved and simplified single side-band system is provided for transmitting signals. Transmission may be effected over any desired channel. For example, the transmission may be effected by the propagation of radiation through space, that is, radio, or it may be effected over conductors.

A signal transmitted by systems embodying the invention may be employed for any desired function. For example, the signals may be employed for communication purposes, for relaying purposes, for telemetering purposes or for supervisory control of any desired equipment.

The invention contemplates the provision of a polyphase carrier wherein the phase components of the carrier are displaced by a substantial angle. In addition, the signal-to-be-transmitted is also produced in polyphase form wherein the phase components are displaced by substantially the same angle present between the phase components of the carrier. Each component of the signal to be transmitted modulates a separate one of the carrier components in a suitable modulator. Preferably the modulator is of the balanced type in order to suppress the carrier component. The outputs of the two modulators consist respectively of the sum and difference of the upper and lower side bands formed by the modulation of the carrier. By suitably adding or subtracting the outputs of the two modulators, either the upper or the lower side band alone may be produced.

In systems embodying the invention, three major problems are present. The balanced modulator must be adequately balanced in order to suppress substantially the carrier supplied thereto. In addition, the outputs of the two modulators must be properly related to effect substantial cancellation of one of the side-bands produced thereby. Finally, adequate equipment must be provided for producing the phase components of the carrier and signal. If phase shifters are employed, the phase shifters must maintain substantially constant amplitude and phase relationships between the associated phase components throughout the required frequency range.

In accordance with an aspect of the invention, barrier-layer modulators are employed. Such modulators may employ rectifiers, such as copper-oxide selenium rectifiers. Of the barrier-layer modulator types, the copper oxide type has been found particularly satisfactory.

Since the impedance of barrier-layer modulators, such as the copper-oxide modulator, is a function of the current passing therethrough, it is possible to balance a modulator having characteristics of this type by passing direct current through appropriate rectifiers in the modulator.

Cancellation of one of the side-bands produced by the two modulators in systems embodying the invention is facilitated by the provision of adjustments for controlling the amplitudes of the outputs derived from the two modulators.

In order to provide polyphase carrier and signal quantities, phase shifters are hereinafter illustrated and described which maintain the amplitude and phase displacement of related components substantially constant over the entire frequency range desired. The phase shifters are of the static type employing only resistors, capacitors and inductance elements.

It is, therefore, an object of the invention to provide an improved system for transmitting signals.

It is a further object of the invention to provide an improved single side-band transmitter.

It is a further object of the invention to provide a single side-band transmitter employing barrier-layer modulators.

It is also an object of the invention to provide means for adjusting the impedance distribution of a barrier-layer modulator.

It is an additional object of the invention to provide means for adjusting the extent of suppression of a carrier in a modulator.

It is a still further object of the invention to provide means for adjusting the extent of cancellation of a side band in a phase-rotation, single-side-band transmitter.

Additional objects of the invention will be apparent from the following discussion taken in conjunction with the accompanying drawing in which:

Figure 1 is a schematic view of a system embodying the invention.

Fig. 2 is a schematic view showing a modified output unit suitable for the system of Fig. 1, and Fig. 3 is a block diagram of a receiver suitable for the system illustrated in Fig. 1.

Referring to the drawing, Fig. 1 shows equipment located at two spaced stations A and B for the transmission and reception of signals between the two stations. Such signals may be transmitted in any suitable manner. However, for the purpose of discussion, it will be assumed that the stations A and B are connected by electric power lines comprising conductors L1 and L2 which are to be employed for guiding signals between the two stations. A system of this type is commonly referred to as a power-line carrier system.

At the station A an oscillator 1 is provided for generating a suitable carrier. This carrier may have any desired frequency. However, for power-line, carrier-transmission purposes, it is conventional to employ frequencies within the range of 50 to 150 kilocycles per second. It is desirable that the oscillator 1 be extremely stable. If desired, it may be of the piezo-electric crystal type. However, master oscillators, which employ no crystals, have been designed in the prior art with sufficient stability for present purposes.

The oscillator 1 is coupled through a suitable transformer 3 to a phase shifter 5. The phase shifter 5 is designed to supply to the primary winding 7A and 9A of two transformers 7 and 9 two carrier phase-components which are displaced from each other by a substantial angle. For example, this angle may be in the range of 60° to 90°. For optimum performance, however, it is desirable that the angle of displacement be substantially 90°. For example, the phase shifter 5 may be designed to apply to the primary winding 7A of the transformer 7 a quantity represented by the expression $E_c \cos 2\pi f_c t$, wherein $E_c$ is a constant amplitude factor, $f_c$ represents the carrier frequency, and t represents time. The phase shifter then may supply to the primary winding 9A of the transformer 9 a phase component represented by the expression $-E_c \sin 2\pi f_c t$. The secondary winding 7B of the transformer 7 is connected across two terminals of a modulator 11. In a similar manner the secondary winding 9B of the transformer 9 is connected across two terminals of a modulator 13.

In order to modulate the carrier components supplied by the transformers 7 and 9, a modulating signal is produced in any desired manner. This signal may be a tone for relay operation, or for telemetering, or for supervisory control purposes, or it may be a voice signal. For present purposes, it will be assumed that a voice signal is provided by means of a microphone 15, the output of which may be amplified, if necessary, by means of an amplifier 17. The output of the amplifier 17 is coupled through a transformer 19 to a phase shifter 21. This phase shifter is designed to produce two signal components which are displaced in phase by substantially the same angle of displacement present between the two carrier components supplied by the transformers 7 and 9.

For example, let it be assumed that a signal having a frequency $f_s$ is supplied through the transformer 19 to the phase shifter 21. The phase shifter then may be designed to provide an output between the conductors 23 and 25 which is represented by the expression $-E_s \sin 2\pi f_s t$, wherein $E_s$ represents an amplitude factor. In addition, the phase shifter provides an output between the conductors 27 and 25 which may be represented by the expression $E_s \cos 2\pi f_s t$. By inspection of Fig. 1, it will be observed that the modulator 11 has applied thereto the carrier component $E_c \cos 2\pi f_c t$ and the signal component $E_s \cos 2\pi f_s t$. Consequently, if the modulator 11 is of the balanced type, the output thereof may be represented by the expression $(E_c \cos 2\pi f_c t)(E_s \cos 2\pi f_s t$. This expression represents the sum of the two side bands produced by the modulator and may be represented by the expression $$\frac{E_c E_s}{2}[\cos 2\pi t(f_c - f_s) + \cos 2\pi t(f_c + f_s)]$$

In a similar manner the modulator 13 has applied thereto the two components represented by the expressions $-E_c \sin 2\pi f_c t$ and $-E_s \sin 2\pi f_s t$. If the modulator 13 is of the balanced type, its output may be represented by the expression $$(E_c \sin 2\pi f_c t)(E_s \sin 2\pi f_s t) = \frac{E_c E_s}{2}[\cos 2\pi t(f_c - f_s) - \cos 2\pi t(f_c + f_s)]$$

The output of the modulator 11 is applied to a load resistor 29 through a coupling transformer 31. Similarly, the output of the modulator 13 is applied to a load resistor 33 through a transformer 35.

From the foregoing discussion, it is clear that the voltage drops across the resistors 29 and 33 represent respectively the sum and difference of the upper and lower side-bands produced by the modulators 11 and 13. Consequently, by adding these voltage drops, the resultant voltage represents the lower side-band. By subtracting the two voltage drops the resultant voltage represents the upper side-band.

The resultant voltage is applied to a suitable amplifier 37. To this end, a conductor 39 is connected to the resistors 29 and 33 through adjustable taps 41 and 43. Each tap and its associated resistor may constitute a potentiometer. By suitable adjustment of the taps, the portions of the voltage drops across the resistors 29 and 33 which are utilized may be adjusted to eliminate substantially one of the side-bands. This is desirable for the reason that the circuits associated with the modulators 11 and 13 may not be exactly similar.

One terminal of the resistor 33 is connected to ground through a conductor 45 and the conductor 25. One terminal of the resistor 29 is connected through a conductor 47 to the amplifier 37. The output of the amplifier 37 may be coupled in any suitable manner to the conductors L1 and L2, as through capacitors 49 and 51.

From the preceding discussion, it is clear that a single side-band signal is applied to the conductors L1 and L2 through the capacitors 49 and 51. This signal may be picked up at the station B in any suitable manner. As illustrated in Fig. 1, a receiver 53 suitable for receiving single side-band signals is coupled to the conductors L1 and L2 at the station B through capacitors 55 and 57.

The system having been described in outline, certain components thereof now will be discussed in greater detail. As previously pointed out, the phase shifter 5 is designed to divide the output of the oscillator 1 into two components displaced by a substantial angle. To this end, a capacitor 59 and a resistor 61 are connected across the secondary winding of the transformer 3. It will be noted that the primary winding 7A is connected substantially across the capacitor 59, whereas the primary winding 9A is connected substantially across the resistor 61. A simple phase shifter corresponding to the capacitor 59 and the resistor 61 would produce substantially a 90° phase displacement between the components supplied to the primary windings 7A and 9A with substantially equal amplitudes for only one frequency of the oscillator 1.

It is desirable that the phase shifter 5 be capable of producing a similar phase shift and maintaining substantially constant amplitude of the components for all frequencies for which the oscillator may be adjusted. As previously pointed out, the oscillator may be designed to operate at any frequency within the range of 50 to 150 kilocycles per second. In order to make the phase shifter 5 effective over this entire range of frequency, a pair of inductance *windings or* coils 63 and 65 are provided which are mutually coupled. By reference to Fig. 1, it will be noted that the coil 63 is connected in series with the capacitor 59 and the resistor 61 across the secondary winding of the transformer 3.

It is well known in the art that the voltage drops across inductance coils and capacitors vary as functions of frequency in opposite directions. Since the coils 63 and 65 are mutually coupled, a voltage is induced in the coil 65 which also varies as a function of frequency. However, the voltage across the coil 65 is substantially in phase with the voltage across the capacitor 59. Since the amplitudes of the voltages across the coil 65 and capacitor 59 vary in opposite directions as the frequency of the oscillator 1 is changed, it may be observed that the components of the phase shifter 5 may be proportioned to maintain the resultant voltage across the coil 65 and the capacitor 59 substantially constant over a small range of frequency, such as a range of 50 to 150 kilocycles per second. Since the primary winding 7A is connected for energization in accordance with this resultant voltage, the voltage applied to this primary winding 7A is rendered substantially constant over the desired frequency range.

Further improvement in the performance of the phase shifter 5 is effected by making the internal impedances of the two output circuits of the phase shifter substantially equal. To this end, a resistor 67 is provided which is substantially equal in value to the value of the resistor 61. Also a capacitor 69 and an inductance *winding or* coil 71 are located in the circuit energized by the voltage across the resistor 61. The capacitor 69 and the inductance coil 71 correspond respectively in value to the capacitor 59 and the inductance introduced by the inductance coil 65.

As representative of suitable values for the components of the phase shifter 5, the following table is presented:

| | | |
|---|---|---|
| Capacitor **59** | microfarad | .01 |
| Capacitor **69** | do | .01 |
| Resistor **61** | ohms | 400 |
| Resistor **67** | do | 400 |
| Mutual coupling between coils **63** and **65** | henry | .0004 |
| Coil **71** | do | .0004 |

These values are suitable for a frequency range of 50 to 150 kilocycles per second and maintain the phase displacement and amplitudes of the outputs of phase shifters substantially constant over this range.

The phase shifter 21 presents a much more serious problem for the reason that is required to handle a frequency range corresponding to the range required for voice communication. For example, in telephone conversation, it is desirable to have a frequency range of the order of 250 to 4,000 cycles per second. For such a range, the phase shifter 21 must handle an upper limit frequency which is approximately 16 times the lower limit frequency.

Certain components of the phase shifter 21 correspond to components of the phase shifter 5. For example, the phase shifter 21 includes inductance *windings or* coils 73, 75 and 76, capacitors 77 and 79 and resistors 81 and 83 which correspond respectively to the coils 63, 65, and 71, the capacitors 59 and 69 and the resistors 61 and 67 of the phase shifter 5. The performances of the corresponding components are similar in the two circuits, but it is to be understood that the values thereof are selected in accordance with the frequencies to be handled thereby. It may be pointed out that the capacitance of the capacitor 59 and the inductance introduced by the coil 63 across the secondary winding of the transformer 3 preferably should be resonated approximately to the geometrical mean of the frequency range which is to be applied to the phase shifter. A similar comment holds for the capacitor 77 and the coil 73 of the phase shifter 21.

If only the components thus far mentioned for the phase shifter 21 were employed, the amplitude of the voltage applied between the conductors 23 and 25 would be equal to the voltage applied between the conductors 27 and 25 for only two frequencies. If the amplitudes of these voltages were plotted as a function of frequency, the curves would intersect at two points. Because of the difference in amplitudes of the voltages within operating range, the cancellation of one side band in the system of Fig. 1 would not be as complete as desired.

In order to improve the performance of the phase shifter 21, an additional resistor 85 of substantial value is connected in series with the secondary winding of the transformer 19. This resistor may have a value sufficient to maintain the current flowing through the secondary winding of the transformer 19 reasonably constant throughout the operating range of the phase shifter.

In addition, a parallel circuit containing an inductance coil 87 and a capacitor 89 is connected between one terminal of the secondary winding of the transformer 19 and the conductor 23, as clearly shown in Fig. 1. This parallel circuit is resonated to a frequency which is substantially the geometric mean frequency of the band which is to be applied to the phase shifter 21. The effect of this parallel resonant circuit is to cause the curves representing the voltage between conductors 23 and 25 and the voltage between the conductors 27 and 25 to approach each other more closely over the desired range. For example they may intersect at four points over the frequency range applied to the phase shifter 21. The deviation between the two curves at any point is small enough to assure excellent operation of the system. Moreover, the phase displacement between the two components is maintained substantially uniform. In a phase shifter similar to the phase shifter 21, tests have shown that it is possible with a range of imput frequency of 250 to 4000 cycles per second to maintain the voltage outputs of the phase shifter balanced in amplitude within 4%, and constant in phase displacement within one degree of 90° over the entire range.

The value of the resistor 85 may vary over a substantial range or the resistor may be omitted completely. Preferably, the value of the resistor 85 is selected to maintain the phase angle between the two output phase components of the phase shifter approximately 90° over a wide range of frequency. To this end, if the phase shifter is designed for a 90° phase angle, the resistor 85 should have a value selected to make the phase angle substantially 90° at the limits of the frequency range to be handled by the phase shifter.

As examples of suitable values for the components of the phase shifter 21, the following table is presented:

| | | |
|---|---|---|
| Inductance coil 73 | henries | .04 |
| Inductance coil 75 | do | .04 |
| Mutual inductance between coils 73 and 75 | do | .04 |
| Coil 76 | do | .04 |
| Capacitor 77 | microfarad | 1 |
| Capacitor 79 | do | 1 |
| Capacitor 89 | do | .0066 |
| Coil 87 | henries | 6 |
| Resistor 81 | ohms | 400 |
| Resistor 83 | do | 400 |
| Resistor 85 | do | 4500 |

The coils may have a Q of 18 measured at a frequency of 1000 cycles per second.

The modulators 11 and 13 may be of any suitable type. However, it is desirable that balanced modulators be employed in order to suppress the carriers supplied thereto from the phase shifter 5. Although electronic tube modulators may be employed, barrier-layer modulators offer a number of advantages. Not only do they eliminate power sources, such as heater transformers and plate voltage supply sources, but they have extremely good modulation characteristics for single side-band work. In addition, the balance thereof may be adjusted by application thereto of direct current as hereinafter pointed out.

The most common barrier-layer rectifiers in use today are those known as selenium and copper-oxide rectifiers. Copper-oxide rectifiers have been particularly satisfactory for the modulators 11 and 13. They may be arranged in various ways as well known in the art. However, in Fig. 1, each modulator is of the ring type and employs four copper-oxide rectifiers 91, 92, 93 and 95. As clearly shown on the drawing, each successive pair of copper-oxide rectifiers has a terminal disposed therebetween for connection to associated transformers. It will be noted that the four copper-oxide rectifiers are arranged substantially in a bridge. If each bridge is balanced, no carrier should appear in the output transformers 31 and 35. However, if a bridge is unbalanced, as by reason of inherent variations in the copper oxide rectifiers, some carrier may appear.

In order to balance or unbalance the modulators as desired, direct current is supplied thereto from a source represented by conductors L3 and L4. These conductors have two potentiometers 97 and 99 connected thereacross. The potentiometers respectively have adjustable taps 101 and 103 associated therewith. The tap 101 is connected through a resistor 108 and the conductor 23 to a center-tap 9C on the secondary winding 9B of the transformer 9. Similarly, the tap 103 is connected through a resistor 105 and the conductor 27 to a center-tap 7C on the secondary winding 7B. In addition, a resistor 107 having a grounded center-tap is connected between the conductors L3 and L4. Center-taps on the primary windings of the transformers 31 and 35 are connected to ground.

A rectifier of the copper-oxide type has a resistance which varies inversely with the current flowing therethrough. Let it be assumed that the tap 103 is adjusted to make the center tap 7C positive with respect to the center-tap 31C. Under these circumstances, current flows through the copper-oxide rectifiers 92 and 95. Since the resistance of such rectifiers varies as a function of current therethrough, this tends to unbalance the bridge represented by the modulator 11, and the extent of unbalance depends on magnitude of the voltage applied between the terminals 7C and 31C. The value of the voltage, in turn, is dependent on the adjustment of the tap 103.

Let it be assumed next that the tap 103 is adjusted to make the tap 7C negative with respect to the tap 31C. Under such circumstances, direct current will flow through the copper-oxide rectifiers 93 and 91. This tends to unbalance the bridge, represented by the modulator 11 in the opposite direction, and the extent of unbalance is adjusted by adjustment of the tap 103.

From the foregoing discussion, it will be clearly apparent that if no audio signal is supplied to the modulator 11, the carrier output of the modulator may be substantially suppressed by proper manipulation of the tap 103. In a similar manner, the tap 101 may be manipulated to adjust the modulator 13.

In certain cases, it may be desirable to unbalance deliberately one of the modulators. For example, in relaying work, operation of a relay may be employed for placing a carrier signal on the conductors L1, L2. Such a carrier signal may be produced by deliberately unbalancing one of the modulators 11 or 13. For example, operation of a relay may be employed to close contacts 113. Closure of the contacts connects the tap 103 to the conductor L4. The resulting application of a direct voltage to the modulator 11 unbalances the modulator and produces a carrier output therefrom. This carrier output is supplied to the conductors L1 and L2.

As previously pointed out, either the upper or lower side-band may be selected as desired. For example, the voltage drops across the resistors 29 and 33 may be connected either additively or subtractively, depending upon the specific side-band desired. The side-band employed also may be changed by interchanging the connections of one of the transformers 31 or 35, or by interchanging the conductors 23 and 27, or by interchanging the inputs to the transformers 7 and 9 from the phase shifter 5.

If desired, the transformers 31 and 35 may be combined, thereby, providing a single secondary winding for connection to the amplifier 37. In this case, the inputs to the two modulators may be adjusted for balancing purposes. However, the preferred embodiment is that illustrated in Fig. 1.

If it is desired to employ the upper and lower side-bands for separate purposes, connections similar to those illustrated in Fig. 2 may be employed. Referring to Fig. 2, it will be observed that two transformers 31A and 35A are shown. These transformers correspond, respectively, to the transformers 31 and 35 of Fig. 1, and the primary connections thereof may be exactly the same as those illustrated for the transformers 31 and 35. It will be observed, however, that the transformer [31] *31A* has two secondary windings 115 and 117. The transformer [35d] *35A* also has two secondary windings 119 and 121. By tracing the connections it will be observed that the windings 115 and 119 are connected in series opposition across the input of an amplifier 123. The same windings are connected in aiding series relationship across the input of an amplifier 125. In a somewhat similar manner, the windings 117 and 121 are connected in series opposition across the input to the amplifier 123, and in series aiding relation across the input to the amplifier 125. By a consideration of Fig. 2, it will be clear that each of the amplifiers 123 and 125 supplies a separate one of the side-bands produced by the system of Fig. 1.

For amplifying purposes, any suitable amplifier may be employed. As shown in Fig. 1, the amplifier 37 includes two pentode tubes 127 and 129 having plate electrodes 127a and 129a respectively, connected through a suitable plate resistor 129b and an inductance coil 127b to a common conductor 131. This conductor 131 is connected to the positive terminal of a source of direct voltage. The negative terminal of the source is connected to ground. The screen grids 127c and 129c of the pentodes also are connected to the conductor 131. The suppressor grid 127d and cathode 127e of the pentode 127 are connected through a cathode resistor 127f and a bypass capacitor 127g to ground. In an analogous manner, the suppressor grid 129d and the cathode 129e of the pentode 129 are connected to ground through a cathode resistor 129f and a bypass capacitor 129g.

The input to the amplifier 37 is derived through the conductor 47 which is connected to the control grid 129h of the pentode 129. The output of the pentode 129 is coupled through a coupling capacitor 133 to the control grid 127h, and a grid resistor 127j associated with the pentode 127. The output of the pentode 127 is applied through a coupling capacitor 135 to a parallel tuned circuit comprising an inductance coil 137 and a capacitor 139. This parallel tuned circuit is tuned substantially to the output frequency of the amplifier. The voltage across this circuit is coupled through the capacitors 41 and 51 to the conductors L1 and L2. As shown in Fig. 1, a center tap on the coil 137 is connected to ground.

It is believed that the operation of the system is clear from the foregoing discussion. If it is desired to communicate by voice signal between the stations A and B, the voice signal is converted into a corresponding audio signal by means of the microphone 15. This audio signal is passed through the phase shifter 21 to provide two components differing in phase by approximately 90°. Similarly the output of an oscillator 1 is passed through the phase shifter 5 to provide two components also differing in phase by substantially 90°. These components are supplied to the ring modulators 11 and 13 to produce carrier-suppressed, double side-band outputs in the secondary windings of the transformers 31 and 35. The outputs of the transformers 31 and 35 are supplied to load resistors 29 and 33 and are combined to eliminate one of the side-bands. The resulting single side-band signal is amplified in the amplifier 37 and applied to the conductors L1 and L2 through the coupling capacitors 49 and 51. This single side-band signal is received by means of a suitable receiver 53 at station B. Similar equipment may be located at each station, if desired, to permit transmission of voice communication from the station B to the station A.

If it is desired to transmit a carrier signal between the stations A and B, the contacts 113 are actuated to unbalance the modulator 11. This results in the generation of a carrier signal which is amplified in the amplifier 37 and applied across the conductors L1 and L2 for reception at the station B.

Sometimes it is desirable to employ a standard superheterodyne receiver for reception of single side-band signals. A receiver of this type is illustrated in block form in Fig. 3.

Referring to Fig. 3, it will be noted that the incoming single side-band signal is represented by the sum or difference of two frequencies $f_c$ and $f_s$ which are, respectively, the carrier and signal frequencies. Either the sum or difference of these frequencies will be received depending on whether the upper or the lower side-band is to be employed. The incoming signal is mixed in a suitable mixer 141 with a frequency equal to $f_c+f_i$, wherein $f_i$ is the intermediate frequency of the superheterodyne receiver. Consequently, the output of the mixer includes a frequency $f_i-f_s$ or $f_i+f_s$, depending on the specific side-band being received. This intermediate frequency is amplified in an intermediate frequency amplifier 143 and supplied to a suitable [modulator] *demodulator* 145 which may be in effect a second mixer stage. If automatic volume control is provided, the controlling signal for the automatic volume control should be derived from the intermediate frequency amplifier prior to demodulation. In the demodulator 145, the intermediate frequency signal is mixed with an oscillation having a frequency $f_i$. Consequently, the desired signal $f_s$ is obtained from the demodulator 145 and may be employed to actuate any suitable translating device 147 such as a loudspeaker.

It will be noted that two specific frequencies $f_c+f_i$ and $f_i$ are injected, respectively, into the mixer 141 and the demodulator 145. If separate sources are provided for these two oscillations, extreme stability would be required for both sources.

In order to simplify the stability problems of the receiver, a local oscillator 149 is provided which is capable of generating a frequency $f_c$. This local oscillator is designed to operate with great stability. Since an oscillator similar to the oscillator 1 of Fig. 1 normally will be available at each station for transmitting purposes, a portion of the output of the oscillator 1 may be employed in place of the local oscillator 149.

The output of the local oscillator 149 is supplied to a mixer 151. This mixer also receives an output from an oscillator 153 which generates an oscillation having substantially the frequency $f_i$. Consequently, the output of the mixer 151 provides the frequency $f_c+f_i$ which is required for the mixer 141. In addition, the oscillator 153 provides an oscillation of the frequency $f_i$ required for the demodulator 145.

In the system of Fig. 3, the oscillator 153 need not be as stable as the oscillator 149. It will be recalled that the intermediate frequency amplifier 143 supplies to the demodulator a quantity represented by the frequency $f_i \mp f_s$. In the demodulator 145, a quantity is produced which is represented by the expression $(f_i \mp f_s) - f_i = \mp f_s$. Consequently, if the frequency $f_i$ varies, such variation does not affect the quantity represented by the frequency $f_s$ which is supplied to the translating device 147. Preferably the oscillator 153 should have a stability sufficient to maintain the signal $f_i \mp f_s$ within the pass band of the intermediate frequency amplifier 143. Consequently, the receiver of Fig. 3 requires great stability only in the local oscillator 149.

Although the invention has been described with reference to certain specific embodiments thereof, numerous modifications are possible. Therefore, the invention is broadly set forth in the appended claims.

I claim as my invention:

1. In a system for producing a single sideband quantity, means for producing a first carrier alternating quantity and a second carrier alternating quantity having a substantial phase displacement therebetween, said first and second carrier quantities being of the same frequency, means for producing a first modulating quantity and a second modulating quantity having substantially said phase displacement therebetween, means for modulating said first carrier quantity by said modulating quantity to produce a first double sideband output, means for modulating said second carrier quantity by said second modulating quantity to produce a second double sideband output, said modulating means comprising barrier-layer modulator means, and means for combining said outputs to eliminate one of said sidebands.

2. In a system for producing a single sideband quantity, means for producing a first carrier alternating quantity and a second carrier alternating quantity having a substantial phase displacement therebetween, said first and second carrier quantities being of the same frequency, means for producing a first modulating quantity and a second modulating quantity having substantially said phase displacement therebetween, means for modulating said first carrier quantity by said first modulating quantity to produce a first double sideband output, means for modulating said second carrier quantity by said second modulating quantity to produce a second double sideband output, said modulating means comprising balanced barrier-layer modulator means wherein the carrier quantities are substantially suppressed, and means for combining said outputs to eliminate one of said sidebands.

3. In a system for producing a single sideband quantity, means for producing a first carrier alternating quantity and a second carrier alternating quantity having a substantial phase displacement therebetween, said first and second carrier quantities being of the same frequency, means for producing a first modulating quantity and a second modulating quantity having substantially said phase displacement therebetween, means for modulating said first carrier quantity by said first modulating quantity to produce a first double sideband output, means for modulating said second carrier quantity by said second modulating quantity to produce a second double sideband output, said modulating means comprising balanced barrier-layer modulator means, means for adjusting the modulator means to eliminate substantially the carrier quantities, and means for combining said outputs to eliminate one of said sidebands.

4. In a system for producing a single sideband quantity, means for producing a first carrier alternating quantity and a second carrier alternating quantity having a substantial phase displacement therebetween, said first and second carrier quantities being of the same frequency, means for producing a first modulating quantity and a second modulating quantity having substantially said phase displacement therebetween, means for modulating said first carrier quantity by said first modulating quantity to produce a first double sideband output, means for modulating said second carrier quantity by said second modulating quantity to produce a second double sideband output, said modulating means comprising balanced barrier-layer modulator means, means for adjusting the modulator means to eliminate substantially the carrier quantities, said last-named means comprising means for introducing direct current into the barrier-layer modulator means, and means for combining said outputs to eliminate one of said sidebands.

5. In an electrical system, a plurality of barrier-layer rectifiers, means connecting said barrier-layer rectifiers in a circuit having parallel paths, and means for adjusting the relative impedances of said paths, said last-named means comprising means for passing biasing current through part of the barrier-layer rectifiers.

6. In an alternating-current electrical system, a plurality of barrier-layer rectifiers, means connecting said barrier-layer rectifiers in a circuit having parallel paths each containing one of the barrier-layer rectifiers, and means for adjusting the relative impedances of said paths, said last-named means comprising means for passing direct current through a preselected part of the barrier-layer rectifiers.

7. In a system for producing a modulated quantity, a barrier-layer modulator having a plurality of paths each containing a barrier-layer rectifier, and means for passing direct current through at least part of said paths for modifying the impedance characteristics thereof.

8. In a system for producing a modulated quantity, a bridge modulator having four paths related to form a bridge circuit, each of said paths including a barrier-layer rectifier, and means for passing direct current through certain of the paths for modifying the balance of the bridge circuit.

9. In a system for producing a modulated quantity, a barrier-layer modulator having a plurality of paths each containing a barrier-layer rectifier, a direct voltage source, and means responsive to the polarity of the source for selectively directing direct current through either of a pair of said barrier-layer rectifiers.

10. In a system for producing a modulated quantity, a ring modulator comprising four ring-connected copper-oxide rectifiers, having a terminal intermediate each adjacent pair of rectifiers to form a resultant bridge circuit, and means for applying a direct voltage between a first pair of the terminals which are disposed on a diagonal of the bridge circuit and the remaining terminals for modifying the balance of the bridge circuit, said means including means for adjusting the magnitude and reversing the polarity of the direct voltage.

11. In a system for producing a single sideband quantity, means for producing a first quantity representing the sum of the upper and lower sidebands of a modulated carrier, means for producing a second quantity representing the difference between said upper and lower sidebands, and means for combining said first and second quantities to eliminate one of the sidebands, said last-named means comprising an adjustable potentiometer energized by one of the quantities for adjusting the relative amplitudes of the first and second quantities to effect substantially complete elimination of one of the sidebands.

12. In a system for producing a single sideband quantity, means for producing a first carrier alternating quantity and a second carrier alternating quantity having a substantial phase displacement therebetween, said first and second carrier quantities being of the same frequency, means for producing a first modulating quantity and a second modulating quantity having substantially said phase displacement therebetween, means for modulating said first carrier quantity by said first modulating quantity to produce a first double sideband output, an adjustable potentiometer connected for energization by said output to provide an adjustable output, means for modulating said second carrier quantity by said second modulating quantity to produce a second double sideband output, said modulating means comprising balanced barrier-layer modulator *means*, means for adjusting the modulator means to eliminate substantially the carrier quantities, said last-named *adjusting* means comprising means for introducing direct current into the barrier-layer modulator means, and means for combining the adjustable output and the second double sideband output, whereby the outputs may be adjusted relative to each other to eliminate substantially one of the sidebands.

13. In a system for shifting the phase of an alternating quantity, means responsive to an alternating input for producing a first quantity and a second quantity having a substantial phase displacement therebetween, said first quantity varying as a function of frequency of the alternating input, means for producing a third quantity varying with the frequency of the alternating input in a manner substantially opposite to the variation of the first quantity, whereby the first and third quantities may be combined to produce a fourth quantity which is substantially [less] *more* immune to variation in frequency of the alternating input than said first and third quantities, means associated with said first and second-named means for producing output circuits for said second and fourth quantities, and means for balancing the internal impedances of the output circuits to which the second and fourth quantities are applied.

14. In a system for shifting the phase of an alternating quantity over a substantial frequency range, means responsive to an alternating input for producing a first quantity and a second quantity having a substantial phase displacement therebetween, said first quantity varying as a function of frequency of the alternating input, means for producing a third quantity varying with the frequency of the alternating input in a manner substantially opposite to the variation of the first quantity, whereby the first and third quantities may be combined to produce a fourth quantity which is substantially [less] *more* immune to variation in frequency of the alternating input than said first and third quantities, means associated with said first and second-named means for producing output circuits for said second and fourth quantities, and means for modifying the phase displacement of the second and fourth quantities adjacent the limits of the frequency range for which the phase shifter is designed.

15. In a system for shifting the phase of an alternating quantity, means responsive to an alternating input for producing a first quantity and a second quantity having a substantial phase displacement therebetween, said first quantity varying as a function of frequency of the alternating input, means for producing a third quantity varying with the frequency of the alternating input in a manner substantially opposite to the variation of the first quantity whereby the first and third quantities may be combined to produce a fourth quantity which is substantially [less] *more* immune to variation in frequency of the alternating input, means associated with said first and second-named means for providing output circuits for said second and fourth quantities, said second and fourth quantities having amplitudes which when plotted as a function of frequency have two points of intersection, and means for varying the amplitude of the second quantity relative to the amplitude of the fourth quantity as a function of frequency to provide more than two points of intersection thereof, whereby the difference in the amplitudes of the second and fourth quantities is small over a substantial range of frequency variation of the alternating input.

16. A system as defined in claim 15 wherein the last-named means comprises a resonant circuit tuned to a frequency within the range of the alternating input, said resonant circuit being connected to alter the amplitude relationships of the second and fourth quantities as a function of frequency.

17. In a system for shifting the phase of an alternating quantity over the range of frequency required for intelligible speech, a circuit comprising a capacitor, a resistor and an inductance winding connected in series for energization from a suitable source in accordance with the alternating quantity, a first output circuit including an inductance winding connected for energization in accordance with the voltage across said capacitor, said inductance windings being mutually coupled to induce in the second-named inductance winding a voltage which adds to the voltage across the capacitor to provide a resultant voltage which is substantially constant over a substantial range of variation in the frequency of the alternating quantity, and a second output circuit connected for energization in accordance with the voltage across said resistor, said capacitor and the inductance introduced by the first-named inductance winding being resonated substantially to the geometrical mean of the frequency range for which the phase shifter is designed.

18. In a system for shifting the phase of an alternating quantity over the range of frequency required for intelligible speech, a circuit comprising a capacitor, a resistor and an inductance winding connected in series for energization from a suitable source in accordance with the alternating quantity, a first output circuit including an inductance winding connected for energization in accordance with the voltage across said capacitor, said inductance windings being mutually coupled to induce in the second-named inductance winding a voltage which adds to the voltage across the capacitor to provide a resultant voltage which is substantially constant over a substantial range of variation in the frequency of the alternating quantity, and a second output circuit connected for energization in accordance with the voltage across said resistor, said output circuits having substantially equal internal impedances.

19. In a system for shifting the phase of an alternating quantity over the range of frequency required for intelligible speech, a circuit comprising a capacitor, a resistor and an inductance winding connected in series for energization from a suitable source in accordance with the alternating quantity, a first output circuit including an inductance winding connected for energization in accordance with the voltage across said capacitor, said inductance windings being mutually coupled to induce in the second-named inductance winding a voltage which adds to the voltage across the capacitor to provide a resultant voltage which is substantially constant over a substantial range of variation in the frequency of the alternating quantity, and a second output circuit connected for energization in accordance with the voltage across said resistor, the series circuit connected for energization from the suitable source including sufficient resistance to maintain current supplied thereto from the source substantially independent of frequency throughout the operating range of the phase shifting system.

20. In a system for shifting the phase of an alternating quantity over the range of frequency required for intelligible speech, a circuit comprising a capacitor, a resistor and an inductance winding connected in series for energization from a suitable source in accordance with the alternating quantity, a first output circuit including an inductance winding connected for energization in accordance with the voltage across said capacitor, said inductance windings being mutually coupled to induce in the second-named inductance winding a voltage which adds to the voltage across the capacitor to provide a resultant voltage which is substantially constant over a substantial range of variation in the frequency of the alternating quantity, and a second output circuit connected for energization in accordance with the voltage across said resistor, and a parallel resonant circuit connected for energization from said suitable source.

21. A system as claimed in claim 20 wherein the parallel resonant circuit is tuned to resonate substantially at the geometrical mean of the frequency range for which the system is designed, and wherein the output circuits have substantially equal internal impedances, said capacitor and the inductance introduced by the first-named inductance winding being resonated substantially to the resonant frequency of the parallel resonant circuit.

22. In a system for producing a single sideband quantity, means for producing polyphase carrier components comprising a first carrier phase component and a second carrier phase component, means for producing polyphase signal components comprising a first signal phase component and a second signal phase component, the phase displacements between the components being of appreciable magnitude and substantially equal for the carrier and signal, a first barrier-layer ring modulator, a second barrier-layer ring modulator, means for applying the first carrier phase component and the first signal phase component to the first modulator to produce a first modulated output therefrom, means for applying the second carrier phase component and the second signal phase component to the second modulator to produce a second modulated output therefrom, and means for combining the outputs to eliminate one sideband therefrom.

23. A system as defined in claim 22 in combination with balance-control-means for introducing with one of said components to the associated one of the modulators a direct-current quantity for modifying the balance of the last-named modulator.

24. A system as defined in claim 23 wherein the balance-control-means is adjustable for varying the magnitude and polarity of the direct-current quantity.

BERNARD E. LENEHAN.

REFERENCES CITED

The following references are of record in the file of this or in the original patent:

UNITED STATES PATENTS

| Number | Name | Date |
|---|---|---|
| 1,666,206 | Hartley | Apr. 17, 1928 |
| 2,163,680 | Hansell | June 27, 1939 |
| 2,173,145 | Wirkler | Sept. 19, 1939 |
| 2,191,315 | Guanella | Feb. 20, 1940 |
| 2,400,133 | Pray | May 14, 1946 |
| 2,414,317 | Middel | Jan. 14, 1947 |